(12) United States Patent
Pethe et al.

(10) Patent No.: US 10,770,338 B2
(45) Date of Patent: Sep. 8, 2020

(54) SYSTEM COMPRISING A SINGLE WAFER, REDUCED VOLUME PROCESS CHAMBER

(71) Applicant: GLOBALFOUNDRIES Inc., Grand Cayman (KY)

(72) Inventors: Wieland Pethe, Dresden (DE); Dirk Noack, Ottendorf-Okrilla (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 30 days.

(21) Appl. No.: 16/225,540

(22) Filed: Dec. 19, 2018

(65) Prior Publication Data
US 2020/0203208 A1     Jun. 25, 2020

(51) Int. Cl.
| | |
|---|---|
| *H01L 21/687* | (2006.01) |
| *H01L 21/677* | (2006.01) |
| *H01L 21/324* | (2006.01) |
| *H01L 21/67* | (2006.01) |

(52) U.S. Cl.
CPC ...... *H01L 21/68742* (2013.01); *H01L 21/324* (2013.01); *H01L 21/67098* (2013.01); *H01L 21/67742* (2013.01); *H01L 21/68785* (2013.01)

(58) Field of Classification Search
CPC .................................................. H01L 21/68742
USPC ....................................................... 438/795
See application file for complete search history.

(56) References Cited

U.S. PATENT DOCUMENTS

| | | | |
|---|---|---|---|
| 6,007,675 A | 12/1999 | Toshima | |
| 6,146,463 A * | 11/2000 | Yudovsky | ........... C23C 16/4583 118/728 |
| 6,719,516 B2 | 4/2004 | Kroeker | |
| 2006/0137609 A1 | 6/2006 | Puchacz et al. | |
| 2014/0299681 A1* | 10/2014 | Kashyap | ........... C23C 16/45525 239/553.5 |
| 2015/0011093 A1* | 1/2015 | Singh | ................ H01L 21/31116 438/712 |
| 2015/0126042 A1* | 5/2015 | Pasquale | ............... C23C 16/402 438/761 |
| 2016/0111318 A1* | 4/2016 | Ichinose | ............. H01L 21/6838 430/322 |
| 2017/0011932 A1 | 1/2017 | Pethe et al. | |
| 2017/0221740 A1* | 8/2017 | Ranjan | .............. H01L 21/67201 |

OTHER PUBLICATIONS

Andrieu, SiGe Channel and Layout EFFETS: Basics Brochure, Cea Tech.
Applied Vantage Vulcan RTP Brochure, Jun. 29, 2011.
Horstmann et al., "Integration and Optimization of Embedded-SiGe, Compressive and Tensile Stressed Liner Films, and Stress Memorization in Advanced SOI CMOS Technologies," 2005 IEEE.
Pidin et al, "A Novel Strain Enhanced CMOS Architecture Using Selectively Deposited High Tensile and High Compressive Silicon Nitride Films," 2004 IEEE.

\* cited by examiner

*Primary Examiner* — Jami Valentine Miller
(74) *Attorney, Agent, or Firm* — Amerson Law Firm, PLLC

(57) ABSTRACT

One illustrative system disclosed herein includes a process chamber positioned within a processing tool and a wafer chuck that is adapted to be positioned at a wafer processing position located within the process chamber and at a chuck wafer transfer position located outside of the process chamber.

19 Claims, 6 Drawing Sheets

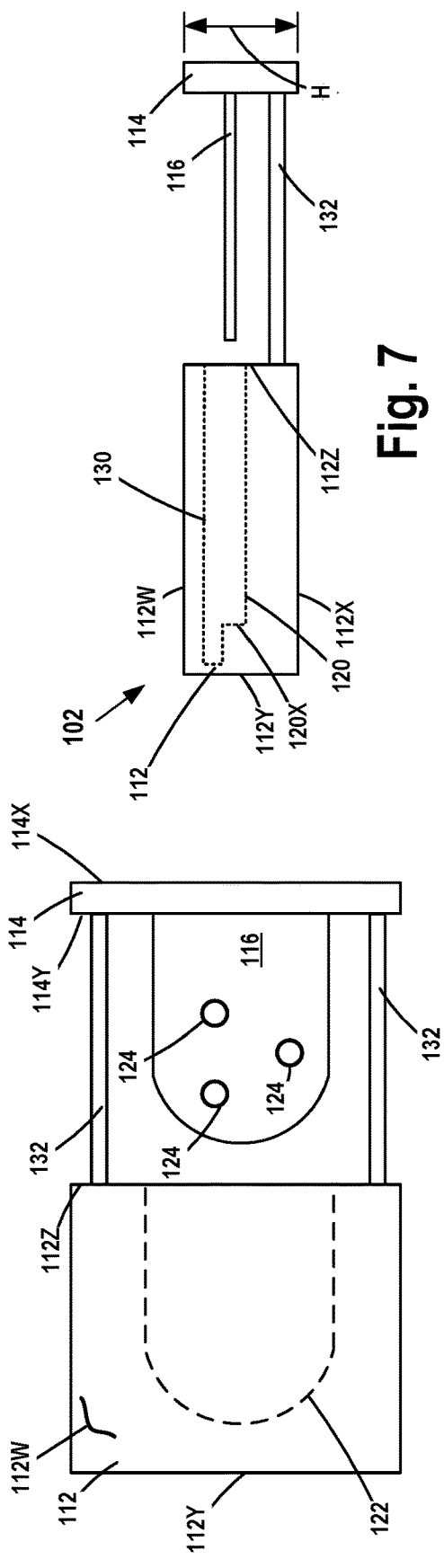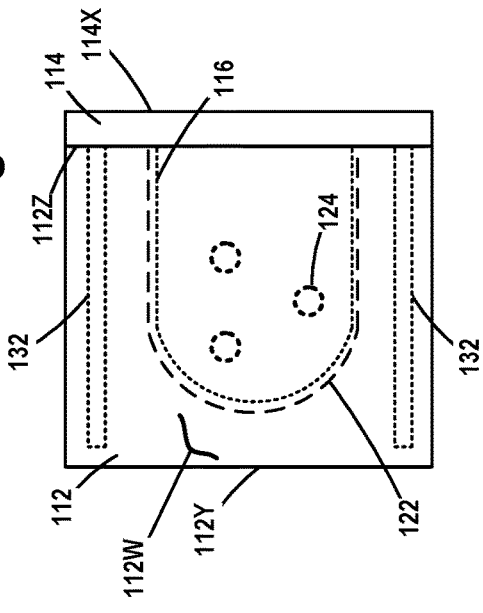

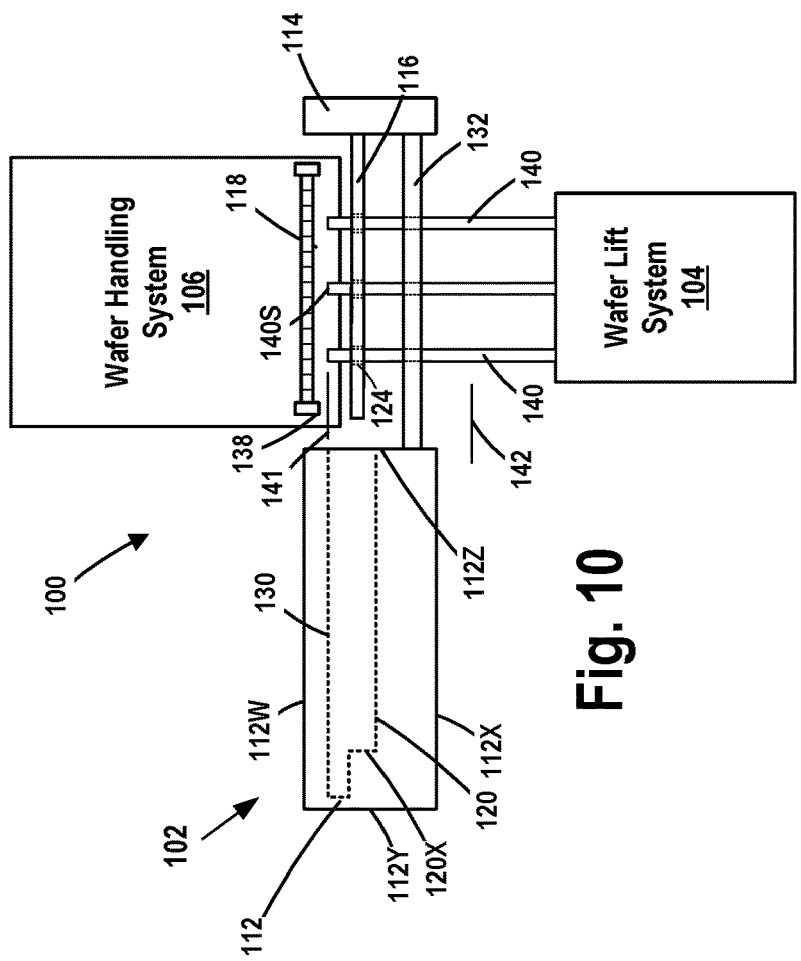
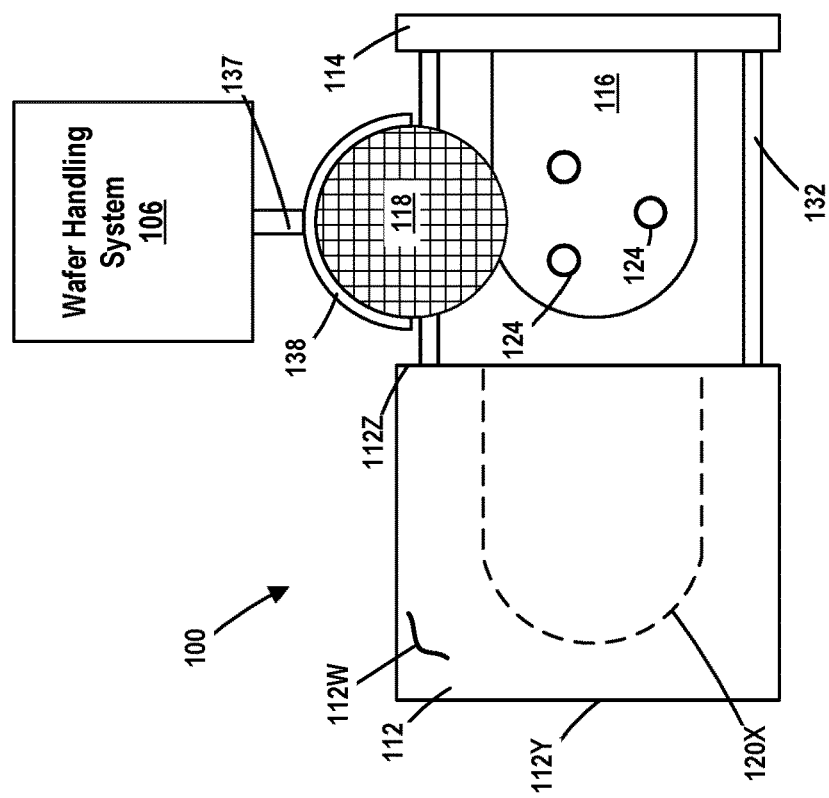

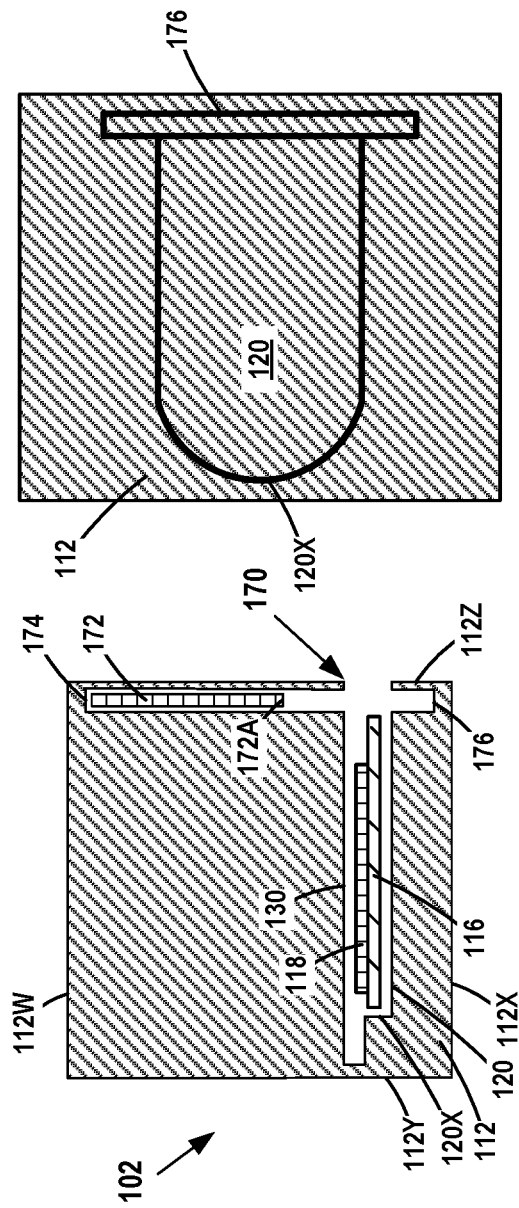

`US 10,770,338 B2`

SYSTEM COMPRISING A SINGLE WAFER, REDUCED VOLUME PROCESS CHAMBER

BACKGROUND

Field of the Disclosure

Generally, the present disclosure relates to various embodiments of a system comprising a single wafer, reduced volume process chamber and methods of processing semiconductor wafers through such a system.

Description of the Related Art

In modern integrated circuit products, such as microprocessors, storage devices, ASICs and the like, a very large number of circuit elements, especially transistors, are provided on a restricted chip area. The transistors come in a variety of shapes and forms, e.g., planar transistors, FinFET transistors, nanowire devices, fully depleted silicon-on insulator (FDSOI) devices, etc. The transistors are typically either NFET or PFET type devices wherein the "N" and "P" designation is based upon the type of dopants used to create the source/drain regions of the devices. Such devices are fabricated on substrates or wafers that are made of a semiconductor material such as silicon.

Formation of such devices comprises performing a variety of different processing operations, such as etching processes, deposition processes, anneal processes, etc., in very specialized processing tools. The wafers may be processed individually within a process chamber or a plurality of wafers may be simultaneously processed in a single process chamber. The nature of the semiconductor manufacturing industry is that there is always a constant drive to reduce manufacturing costs to improve profit margins and meet the always constant demand from customers for lower prices. Thus, one tendency is to process as many wafers as possible at a single time to increase throughput and thereby meet ever increasing production goals.

In modern semiconductor fabrication facilities, the wafers that are processed are typically moved among, between and within the many processing tools in such a facility by use of a variety of automated wafer transfer systems. One common arrangement typically involves positioning a carrier of wafers that includes a plurality of individual wafers at a location where a robotic arm may, on an as-needed basis, grasp individual wafers from the carrier and distribute those wafers to one or more processing chambers where the processing operations will be performed. Additionally, wafer lift systems are typically present within each process chamber to receive a wafer from the robotic arm and, typically, thereafter lower the wafer to a processing position where the wafer will be processed within the chamber. The robotic arm is then withdrawn from the chamber and the processing operation is performed on the wafer. Typically, such processing operations may involve the use of one or more processing gases, and such processing operations may have to be performed under relatively high pressure conditions, thereby necessitating the use of relatively large volumes of processing gases. Moreover, in some applications, the processing gases may be relatively expensive. As a result, performing some process operations in process chambers with a relatively large volume may necessitate the use of significant volumes of relatively expensive process gases thereby increasing the cost of production of integrated circuit products.

The present disclosure is directed to various embodiments of a system comprising a single wafer, reduced volume process chamber and methods of processing semiconductor wafers through such a system that may avoid, or at least reduce, the effects of one or more of the problems identified above.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various embodiments of a system comprising a single wafer, reduced volume process chamber and methods of processing semiconductor wafers through such a system. One illustrative system disclosed herein includes a process chamber positioned within a processing tool and a wafer chuck that is adapted to be positioned at a wafer processing position located within the process chamber and at a chuck wafer transfer position located outside of the process chamber.

Another illustrative system disclosed herein includes a process chamber positioned within a processing tool, a wafer chuck that is adapted to be positioned at a wafer processing position located within the process chamber, a chuck wafer transfer position located outside of the process chamber and at least one lift pin opening in the wafer chuck. In this example, the system also includes a wafer lift system positioned outside of the process chamber that is adapted to move at least one wafer lift pin though the lift pin opening and position the at least one wafer lift pin at a lift pin wafer transfer position and a wafer transfer system that is adapted to position a wafer to be processed in the process chamber on the at least one wafer lift pin when the at least one wafer lift pin is in the lift pin wafer transfer position.

One illustrative method disclosed herein includes positioning a wafer chuck at a chuck wafer transfer position located outside of a process chamber of a processing tool, wherein the wafer chuck has at least one lift pin opening that extends through the wafer chuck, moving at least one wafer lift pin through the at least one lift pin opening to a position where the at least one wafer lift pin is at a lift pin wafer transfer position and positioning a wafer to be processed in the process chamber on the at least one wafer lift pin when the at least one lift pin is in the lift pin wafer transfer position. In this example, the method also includes moving the at least one wafer lift pin to a retracted lift pin position such that the at least one wafer lift pin is no longer positioned in the at least one lift pin opening and the wafer to be processed in the process chamber is positioned on the wafer chuck, moving the wafer chuck to a wafer processing position within the process chamber, and performing a process operation on the wafer to be processed in the process chamber.

BRIEF DESCRIPTION OF THE DRAWINGS

The disclosure may be understood by reference to the following description taken in conjunction with the accompanying drawings, in which like reference numerals identify like elements, and in which:

FIGS. 1-18 depict various illustrative various embodiments of a system comprising a single wafer, reduced volume process chamber and methods of processing semiconductor wafers through such a system.

Figure 3:
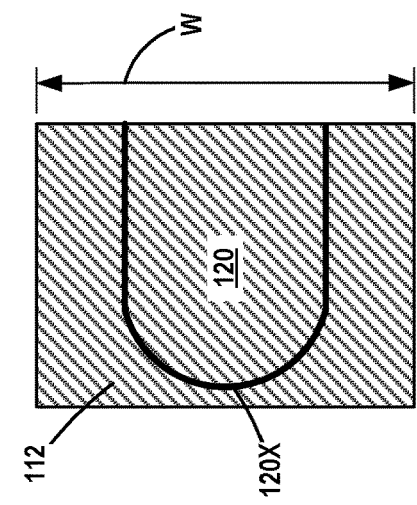

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily appreciated by those skilled in the art upon a complete reading of the present application, the methods and systems disclosed herein may be employed in manufacturing a variety of different devices, including, but not limited to, logic devices, memory devices, etc., and the devices may be may be either NFET or PFET devices. Of course, the inventions disclosed herein should not be considered to be limited to the illustrative examples depicted and described herein. With reference to the attached figures, various illustrative embodiments of the methods and devices disclosed herein will now be described in more detail.

Figure 1:
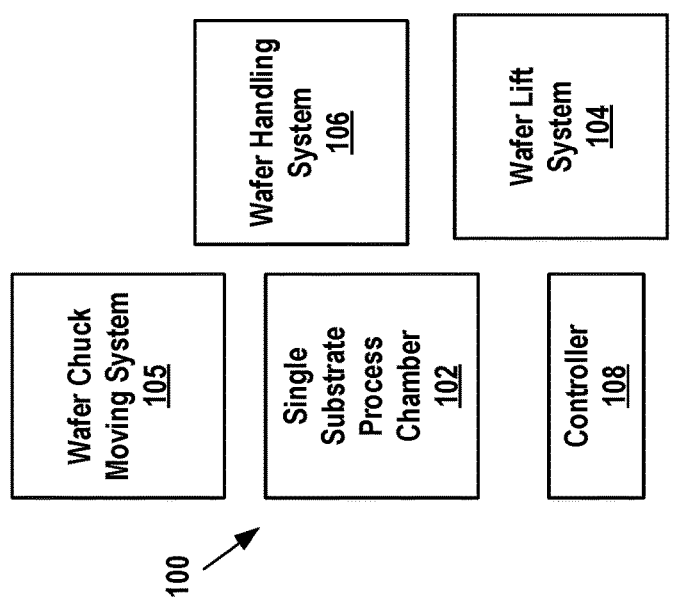

FIGS. 1-18 depict various embodiments of a system 100 comprising a processing tool 102 and methods of processing semiconductor wafers through such a system. FIG. 1 is a block level depiction of one illustrative embodiment of some of the major components of one illustrative embodiment of a system 100 disclosed herein. In general, the system 100 comprises a processing tool 102 with a small-volume process chamber 130 (see FIG. 2), a wafer lift system 104, a wafer chuck moving system 105, a wafer handling system 106 and a system controller 108. Of course, other aspects of any real-world system, such as electrical power supplies, seals, process gas inlets, vents, supplies of processing gases, etc., are not depicted in FIG. 1 so as to not obscure the presentation of the subject matter disclosed herein. The processing tool 102 may be used as one part of an elaborate fabrication process to manufacture semiconductor wafers into functional semiconductor devices and various integrated circuit products.

The illustrative embodiment of the system 100 shown in FIG. 1 only includes a single processing tool 102, a single wafer lift system 104, a single wafer chuck moving system 105, a single wafer handling system 106 and a single controller 108. However, as will be appreciated by those skilled in the art after a complete reading of the present application, the depiction of such single entities is representative in nature in that a real-world system 100 may include any desired number of each of the five components that may be arranged in a variety of different configurations. For example, a system 100 may include a plurality of individual processing tools 102, each of which is serviced by a single wafer lift system 104, a single wafer chuck moving system 105, a single wafer handling system 106 and one or more controllers 108, all of which may be housed in one or more cabinets. In other embodiments, each of the processing tools 102 may be serviced by a dedicated single wafer lift system 104, a dedicated wafer chuck moving system 105, a dedicated single wafer handling system 106 and a single dedicated controller 108. The controller(s) may be a stand-alone computer(s) or it (or they) may be housed in any of the components of the system 100 or dispersed in the various components of the system 100. Thus, the subject matter disclosed herein should not be considered to be limited to any particular form or arrangement of the various components of the systems disclosed herein.

As will be understood by those skilled in the art, the terms "wafer" and "substrate" are used interchangeably herein, and both are directed to any form or shape of any semiconductor material wherein integrated circuits (of any type, shape or form) are formed on the wafer or substrate. In the example depicted herein, the substrate 118 is simplistically depicted as being comprised of a single bulk semiconductor material. However, as will be appreciated by those skilled in the art after a complete reading of the present application, the presently disclosed subject matter should not be considered to be limited to this illustrative example of the substrate 118. For example, the substrate 118 may be an FDSOI (fully depleted silicon-on-insulator) substrate. In general, such an SOI substrate comprises a base semiconductor substrate, a buried insulation layer (sometime referred to as a "BOX" layer when the insulation layer comprises silicon dioxide) positioned on the base substrate and an active layer comprised of a semiconducting material positioned on the buried layer of insulating material. Traditionally, and in one illustrative embodiment, the base semiconducting substrate may comprise silicon, the buried insulation layer may comprise silicon dioxide and the active layer may comprise silicon and/or other semiconductor materials. Of course, the base semiconducting substrate and the active layer may be made of any of a variety of different semiconductor materials, and the materials for the base semiconducting substrate and the active layer need not be made of the same material in all applications, but such a situation may occur in some applications. Thus, the terms "substrate", "semiconductor substrate" or "wafer" should be understood to cover all semiconducting materials and all forms of such materials.

FIGS. 2-8 depict various views of one illustrative embodiment of a processing tool 102 with a small-volume process chamber 130 that may be employed in the systems 100 disclosed herein. In one embodiment, the process chamber 130 is sized such that only a single wafer may 118 be processed in the process chamber 130 during a given processing cycle. In the depicted example, the processing tool 102 has an overall generally rectangular, three-dimensional configuration with a length ("L"), a width ("W") and a height ("H") (see FIG. 7). The absolute values of the length, width and height measurements may vary depending upon the particular application. Of course, all of the drawings in the present application are not to scale.

Figure 2:
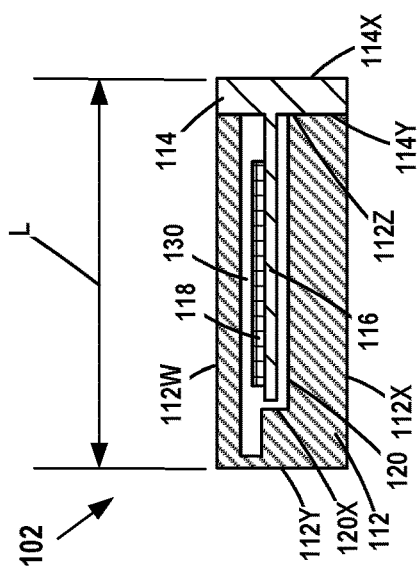

FIG. 2 is a cross-sectional view of one illustrative embodiment of the processing tool 102 disclosed herein. As noted above, the processing tool 102 is adapted to process only one single wafer 118 during a given processing cycle. In this illustrative embodiment, the processing tool 102 comprises a body 112, a chamber door 114, a wafer chuck 116 and an internal small-volume processing chamber 130. The wafer chuck 116 is adapted to have the wafer 118 that is to be processed in the chamber 130 positioned on the wafer chuck 116. The floor of the process chamber 130 comprises a notched chuck recess 120 with a partial circular end surface 120X. The notched chuck recess 120 is adapted to receive the wafer chuck 116 when the wafer chuck 116 is positioned at the wafer processing position within the chamber 130. In this example, the body 112 comprises a top surface 112W, a bottom surface 112X, a back surface 112Y and a front surface 112Z. The chamber door 114 has a front surface 114X and a back surface 114Y. In general, the chamber door 114 is adapted to sealingly engage the front surface 112Z of the processing tool 102/process chamber 130 so as to effectively close and seal the chamber 130. In the depicted example, the wafer chuck 116 is formed integral with the back surface of the chamber door 114. The attachment of the wafer chuck 116 to the chamber door 114 may be accomplished by a variety of techniques (e.g., welding, a bolted connection, etc.).

Figure 4:
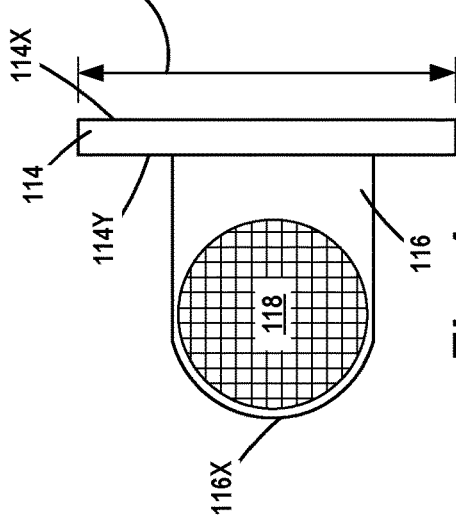

FIG. 3 is a simplistic plan view of only the bottom floor of the process chamber 130. The notched chuck recess 120 formed in the floor of the chamber 130 is depicted in this view. FIG. 4 is a simplistic plan view of the wafer chuck 116/chamber door 114 with the wafer 118 in position on the wafer chuck 116. In the depicted example, the wafer chuck 116 comprises a partial circular end surface 116X that is adapted to be positioned adjacent the circular end surface 120X of the notched chuck recess 120 when the wafer chuck 116 is positioned at its fully-inserted, wafer-processing position within the process chamber 130.

Figure 5:
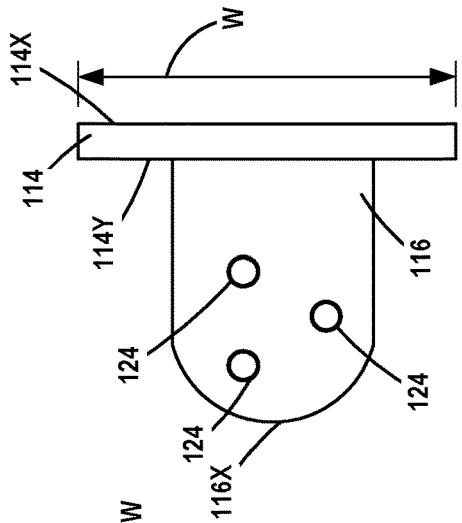

FIG. 5 is a simplistic plan view of the wafer chuck 116/chamber door 114 without the wafer 118. As indicated, a plurality of lift pin holes 124 are provided in the wafer chuck 116 so as to permit a plurality of wafer lift pins 140 (discussed below) of the wafer lift system 104 to pass through the lift pin holes 124. In general, an upper surface 140S of the wafer lift pins 140 is adapted to engage a bottom surface of a wafer 118 that is positioned on or above an upper surface of the wafer chuck 116 when the wafer chuck 116 is in its chuck wafer transfer position (see, e.g., FIGS. 6-7 (wherein a wafer 118 may or may not be present). The number and size of the lift pin holes 124 may vary depending upon the particular application. In the depicted example, three such lift pin holes 124 are provided in the wafer chuck 116. The wafer chuck 116 may be a heated chuck that is capable of heating the wafer 118 by, for example, electrical resistance heating, or it may be a non-heated chuck.

FIGS. 6 and 7 are simplistic plan and side views, respectively, depicting the chamber door 114 in its open position whereby the wafer chuck 116 is in its chuck wafer transfer position without a wafer 118 in place on the wafer chuck 116. FIG. 8 is a simplistic plan view depicting the chamber door 114 in its closed position whereby the wafer chuck 116 is in its wafer processing position without the wafer 118 in position on the wafer chuck 116.

In one illustrative example depicted herein, the wafer chuck moving system 105 comprises a plurality of support rods 132 that are operatively coupled (directly or indirectly) to the wafer chuck 116, and means for moving the wafer chuck 116 from the wafer processing position within the process chamber 130 to the chuck wafer transfer position. As described more fully below, when the wafer chuck is in its chuck wafer transfer position, a wafer 118 may be transferred to or from the wafer chuck 116 by positioning the wafer on the wafer lift pins 140 when the wafer lift pins 140 have been extended through the lift pin openings 124. As indicated, in one illustrative embodiment, the plurality of support rods 132 are operatively coupled to the body 112 and the chamber door 114. The support rods 132, along with the means of actuating the support rods 132, are adapted to provide the means for moving the wafer chuck 116 from its wafer-processing position (FIG. 8), wherein the chamber door 114 is sealingly engaged to the process chamber 130, to retracted or open chuck wafer transfer position (FIG. 6 or 7) whereby a wafer 118 may be positioned on or removed from the wafer chuck 116. FIG. 8 depicts the position of the support rods 132 (in dashed lines) with the chamber door 114 in its closed position as well as the position of the wafer chuck 116 in its wafer processing position (without the wafer 118). In this position, the support rods 132 are positioned within recesses or channels (not shown) formed in the body 112 of the processing tool 102 that are adapted to receive the support rods 132. As noted above, the position of the support rods 132 with the wafer chuck in its chuck wafer-transfer position are shown in FIGS. 6 and 7.

The components of the wafer chuck moving system 105 may comprise any of a variety of traditional electro-mechanical actuation means or devices. For example, the wafer chuck moving system 105 may include means for actuating the support rods 132 that may comprise one or more hydraulically or pneumatically actuated cylinders (not shown), one or more position detecting switches (e.g., limit switches) and one or more electrical motors (not shown) that are operatively coupled (directly or indirectly) to the support rods 132 so as to move them from the retracted position to the extended position, and vice-versa. The structure, function and operation of such wafer chuck moving systems 105 are well known to those skilled in the art.

In one illustrative embodiment, when the wafer chuck 116 is in its chuck wafer transfer position (see FIGS. 6 and 7), the combination of the wafer lift system 104 and the wafer handling system 106 is adapted to either (1) position a wafer 118 that is to be processed in the chamber 130 on the wafer chuck 116 or (2) remove a wafer 118 that was previously processed in the chamber 130 from the upper surface of the wafer chuck 116.

FIG. 9 is a simplistic plan view of one illustrative embodiment of a novel system 100 disclosed herein wherein one illustrative embodiment of the wafer handling system 106 is depicted. The controller 108 and the wafer lift system 104 are not depicted in FIG. 9. FIG. 10 is a side view of the illustrative embodiment of the system 100 shown in FIG. 9.

The controller 108 is not depicted in FIG. 10, but the wafer lift system 104 is simplistically depicted in FIG. 10.

With reference to FIGS. 9 and 10, the simplistically depicted wafer handling system 106 comprises a robotic arm 137 that comprises a wafer gripper assembly 138 that is operatively coupled to an end of the robotic arm 137. The combination of the robotic arm 137 and the wafer gripper assembly 138 is adapted to grasp and retrieve a single wafer 118 from a wafer carrier (not shown) that contains a plurality of individual wafers 118 that are to be processed—one by one—in the process chamber 130. As described more fully below, the combination of the robotic arm 137 and the wafer gripper assembly 138 is also adapted to (1) position and place a particular grasped wafer 118 on the wafer lift pins 140 when the wafer lift pins 140 are in their extended lift pin wafer transfer position, and (2) grasp and remove a wafer 118 from the extended wafer lift pins 140 after that wafer was previously processed in the chamber 130 and return it to the wafer carrier. The wafer handling system 106 depicted herein may have a structure and functional capabilities equivalent to any of a variety of different wafer handling systems that are commercially available in the marketplace. As noted above, the wafer handling system 106 may be representative of one or more physical wafer handling systems, each of which is adapted to serve one or more process chambers 130 in an overall system 100.

Figure 11:
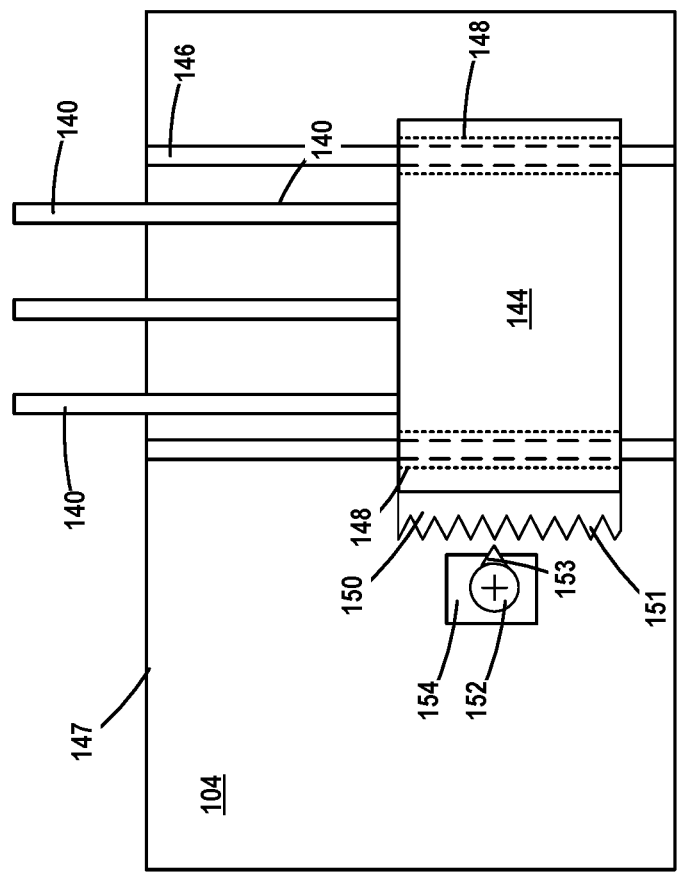

FIGS. 10 and 11 simplistically depict one illustrative embodiment of a wafer lift system 104 that may be employed in various systems disclosed herein. The wafer lift system 104 comprises a plurality of wafer lift pins 140, each of which have an upper wafer-engaging surface 140S. Each of the wafer lift pins 140 is adapted to be extended through a corresponding one of the lift pin holes 124 in the chuck 116. The wafer lift pins 140 may be moved from an extended position (shown in FIG. 10) whereby the upper surfaces 140S of the wafer lift pins 140 are positioned in a plane 141—the lift pin wafer transfer position. When the lift pins 140 have been moved through the openings 124 in the chuck 116 to their extended lift pin wafer transfer position, the wafer transfer system 106 may be actuated to either (1) position a wafer 118 (that is to be processed in the process chamber 130) on the extended wafer lift pins 140 or (2) lift a wafer 118 (that was previously processed in the processing tool 102) off of the extended wafer lift pins 140 and position that processed wafer 118 in a wafer carrier (not shown). The wafer lift pins 140 are also adapted to be moved to a retracted position whereby the upper surfaces 140S of the lift pins 140 are in a plane 142 that is at least below the level at which the wafer lift pins 140 are no longer in a position to interfere with the movement of other system components, e.g., so as not to interfere with the chamber door 114 being moved from a closed position to an open position, or vice-versa, with respect to the process chamber 130. In one illustrative embodiment, the wafer lift pins 140 may be fully retracted such that the wafer lift pins 140 are completely retracted to a position within a housing (not shown) of the wafer lift system 104. The number and size of the wafer lift pins 140 may vary depending upon the particular application. In the disclosed embodiment, three illustrative wafer lift pins 140 are depicted. As will be appreciated by those skilled in the art after a complete reading of the present application, since the wafer lift system 104 disclosed herein is physically positioned outside of process chamber 130, the lift pins 140 will be moved from their retracted position to their extended position only when the wafer chuck 116 is in its wafer-transfer position as shown in FIG. 10.

The wafer lift system 104 depicted herein may have a structure and functional capabilities equivalent to any of a variety of different wafer lift systems that are commercially available in the marketplace. The wafer lift pins 140 may be actuated from a retracted position (wherein the surfaces 140S are at or below the plane 142) to an extended position (wherein the surfaces 140S are at the plane 141 and the wafer lift pins 140 are in the lift pin wafer transfer position), and vice-versa, by using any of a variety of traditional electro-mechanical actuation means and devices. For example, the means for actuating the wafer lift pins 140 may comprise one or more hydraulically or pneumatically actuated cylinders (not shown), one or more position detecting switches (e.g., limit switches) and/one or more electrical motors (not shown) that are operatively coupled (directly or indirectly) to the wafer lift pins 140 so as to move them from the retracted position to the extended position, and vice-versa. The structure, function and operation of such systems for moving the wafer lift pins 140 are well known to those skilled in the art.

FIG. 11 simplistically depicts one illustrative example of a means by which the wafer lift pins 140 may be moved from an extended position to a retracted position and vice-versa. As shown therein, the plurality of wafer lift pins 140 are operatively coupled to a moveable block 144 positioned within a housing 147. A plurality of fixed guide rods 146 are a coupled to the housing 147. Fixed guide rods 146 extend through openings 148 formed in the moveable block 144. A rack 150 is fixed to the side of the moveable block 144. The rack 150 comprises a plurality of teeth 151. Also shown in FIG. 11 is a schematically depicted electric motor 154 (e.g., a stepper motor) that is in a fixed position within the housing 147. An illustrative pinion 152 is operatively coupled to the shaft (not separately shown) of the motor 154. The pinion 152 comprises a plurality of teeth 153 (only one of which is shown). The teeth 153 on the pinion 152 are adapted to mesh with the teeth 151 on the rack 150. In this example, due to the interaction between the teeth 153/151 when the motor 154 is actuated, the moveable block 144 travels up or down (depending upon the direction of rotation of the pinion 152) on the fixed guide rods 146, thereby causing the attached wafer lift pins 140 to be moved to their extended or retracted positions.

The illustrative controller 108 shown in FIG. 1 is intended to be a broad representation of any type of one or more computing devices that may be programmed so as to perform the various functions described herein. In the illustrated embodiment, the controller 108 is a computer programmed with software to implement the functions described herein. Moreover, the functions described for the controller 108 may be performed by one or more controllers spread through the system 100. For example, the controller 108 may be a fab level controller that is used to control processing operations throughout all or a portion of a semiconductor manufacturing facility. Alternatively, the controller 108 may be a lower level computer that controls only portions or cells of the manufacturing facility. Moreover, the controller 108 may be a stand-alone device (or a plurality of stand-alone devices that operatively function with one another), or it may reside on or among any of the processing tool 102, the wafer lift system 104 and/or the wafer handling system 106. However, as will be appreciated by those of ordinary skill in the art, a hardware controller (not shown) designed to implement the particular functions may also be used.

The processing tool 102 disclosed herein may be employed to perform any type of processing operation. In one illustrative example, the processing tool 102 may be adapted to perform an anneal process in the processing chamber 130. In one very particular embodiment, the processing tool 102 may be employed to perform a high-pressure anneal process in the process chamber 130 using a process gas that comprises deuterium or a halogen as at least one of the process gasses during the anneal process (an HPD2 anneal process). In one illustrative embodiment, the HPD2 anneal process may be performed at a pressure of about 0.5-3 MPa and at a temperature of about 300-500° C. Traditional HPD2 anneal tools are batch furnaces. Traditional single wafer anneal tools have a much larger volume as compared to the volume of the processing chamber 130 disclosed herein. According to the present disclosure, the volume of the processing chamber 130 is made as small as is reasonably practicable so as to reduce the volume of process gas, e.g., deuterium, that is required to generate the high-pressure processing condition during the anneal process. This is an important feature given that deuterium is a relatively expensive process gas. Reducing the consumption of deuterium during each processing cycle may lead to significant cost savings. In traditional batch furnaces, where such HPD2 anneal processes are performed, the wafer lift systems are typically positioned within the processing chamber, thereby causing an inside dimension of the process chamber to be large enough (at least in the vertical direction) to accommodate the wafer lifting system hardware and movement of such hardware during wafer lifting processes. In turn, these factors tend to increase the volume of the prior art process chamber beyond what is actually necessary to perform the processing operation. This excess processing volume must be filled with processing gas to perform the desired processing operation. In one illustrative example, such single-wafer prior art processing tools (that were typically not used for HPD2 anneal processes) may have a process chamber with a volume of about 10-30 liters. In contrast, due to the placement of the wafer lift system 104 outside of the process chamber 130, the volume of the process chamber 130 may be specifically designed to have a relatively small volume as compared to the process chambers in prior art annealing tools. For example, in one illustrative embodiment, where the wafer 108 has a diameter of about 200-300 mm, the internal volume of the process chamber 130 disclosed herein may be about 0.2-5 liters. Of course, the absolute volume of the pressure chamber 130 may vary depending upon the particular application and the size of the wafers 118 processed therein.

FIGS. 12-18 depict various views of another illustrative embodiment of the processing tool 102 with a small-volume process chamber 130 that may be employed in the systems 100 disclosed herein. In general, in this embodiment, in lieu of the chamber door 114 depicted above, this embodiment of the processing tool 102 comprises a slot 170 that permits or blocks access to the process chamber 130. As best seen in FIG. 12, an upper door recess 174 and a lower door recess 176 are formed in the body 112. The upper door recess 174 and the lower door recess 176 are adapted to receive a sliding door 172 that may be actuated to open or close the slot 170. In FIG. 12, the sliding door 172 is depicted in its raised position whereby slot 170 is open and the wafer chuck 116 may be inserted into or withdrawn from the process chamber 130. As before, in one embodiment, the process chamber 130 is adapted to process only a single wafer 118 during a given processing cycle.

FIG. 13 is a simplistic plan view of just the bottom or floor of the chamber 130 with the wafer chuck 116 removed. The lower door recess 176 is also depicted in FIG. 13. FIG. 14 is a simplistic plan view of the wafer chuck 116 with the wafer 118 in position on the chuck 116. Note that, in this example, a plurality of attachment structures 116A are coupled to the wafer chuck 116. In practice, the attachment structures 116A may be components that are physically separate from the wafer chuck 116, or they may be formed as an integral part of the wafer chuck 116. The attachment structures 116A are adapted to be operatively coupled to the above-described support rods 132. In some embodiments, the attachment structures 116A may simply be an extension of the support rods 132. FIG. 15 is a simplistic plan view of this illustrative example of a wafer chuck 116 with the wafer 118 removed. As before, a plurality of lift pin holes 124 are provided in the wafer chuck 116 so as to permit the above-described wafer lift pins 140 of the wafer lift system 104 to pass through the lift pin holes 124 and thereby engage the bottom of a previously processed wafer 118 that is positioned on the upper surface of the wafer chuck 116 when the wafer chuck 116 is moved from its wafer processing position within the process chamber 130 to its chuck wafer transfer position by actuation of the wafer chuck moving system 105.

Figure 16:
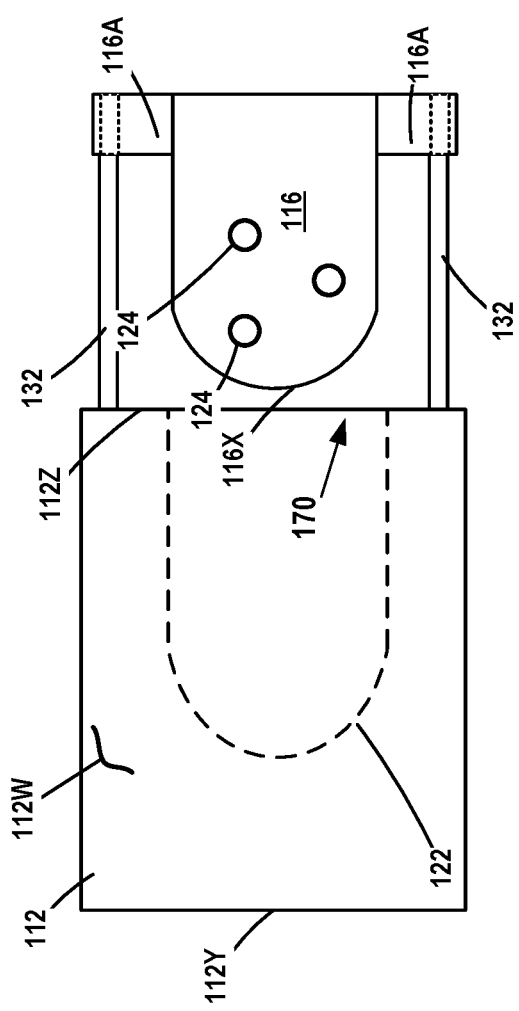
Figure 17:
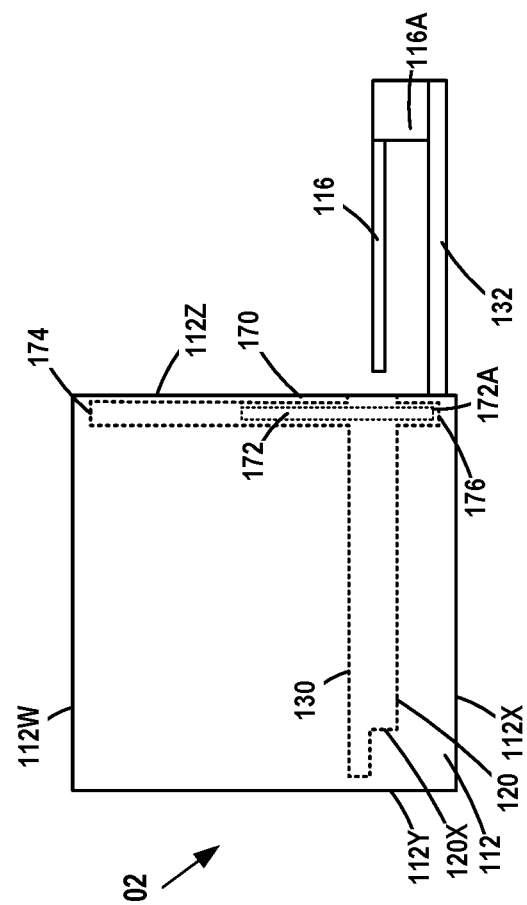
Figure 18:
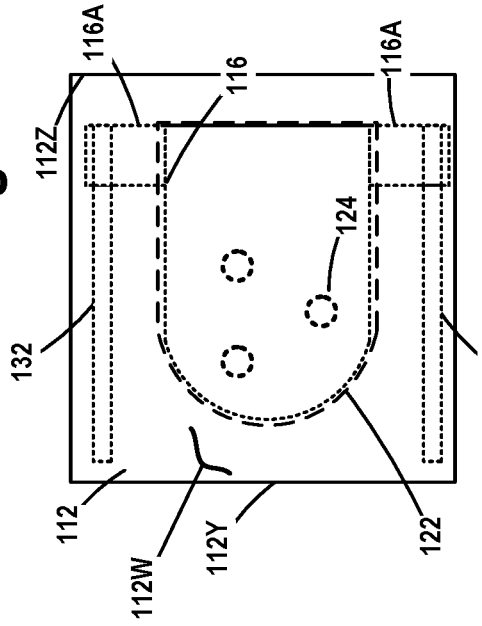

FIGS. 16 and 17 are simplistic plan and side views, respectively, depicting the wafer chuck 116 in its chuck wafer-transfer position without a wafer 118 in place on the wafer chuck 116. FIG. 18 is a simplistic plan view depicting the wafer chuck 116 in its wafer processing position within the chamber 130 without the wafer 118 in place on the wafer chuck 116. No attempt has been made to show the upper door recess 172 or the lower door recess 176 in FIGS. 16 and 18. The upper door recess 172 and the lower door recess 176 are shown in FIG. 17. FIG. 17 also depicts the sliding door 172 in its closed position whereby the slot 170 is blocked and access to the chamber 130 is blocked. Note that in its closed position, a lower end 172A of the sliding door 172 is positioned within the lower door recess 176.

As indicated, the plurality of support rods 132 are operatively coupled to the body 112 and the attachment structures 116A. As before, the support rods 132, along with the means of actuating the support rods 132, are adapted to enable the movement of the wafer chuck 118 from in its wafer processing position within the chamber 130 (FIG. 18) to its chuck wafer transfer position outside of the process chamber 130 (FIG. 16 or 17). The position of the support rods 132 with the sliding door 172 closed and the wafer chuck in wafer processing position within the process chamber 130 are shown in FIG. 18. As before, in this position, the support rods 132 are positioned within recesses or channels (not shown) in the body 112 that are adapted to receive the support rods 132. The support rods 132 may be actuated using various means as previously described. The sliding door 170 may be actuated from a retracted position (FIG. 12) whereby the slot 170 is open, to an extended position (FIG. 17) whereby the slot 170 is closed, and vice-versa, by using any of a variety of traditional electro-mechanical actuation means that are well known to those skilled in the art. For example, the means for actuating the sliding door 170 may comprise one or more hydraulically or pneumatically actuated cylinders (not shown), one or more position detecting switches (e.g., limit switches) and one or more electrical motors (not shown) that are operatively coupled (directly or indirectly) to the sliding door 170 so as to move it from the retracted position to the extended position, and vice-versa.

This embodiment of the processing tool 102 is adapted to interact with the above-described wafer lift system 104 and wafer handling system 106 in substantially the same manner as does the previous embodiment. For example, as with the previous embodiment, when the wafer chuck 116 is in its chuck wafer transfer position (see FIGS. 16 and 17), the combination of the wafer lift system 104 and the wafer handling system 106 is adapted to either (1) position a wafer 118 that is to be processed in the chamber 130 on the wafer chuck 116 or (2) remove a wafer 118 that was previously processed in the chamber 130 from the wafer chuck 116.

One illustrative process flow or method of using one illustrative embodiment of the system disclosed herein will now be described. It is assumed that a carrier containing a plurality of wafers to be processed in the processing tool 102 is in a position whereby the wafer handling system 106 can access those wafers and that the processing tool 102 is empty:

1. Move the wafer chuck 116 to its chuck wafer transfer position outside of the process chamber 130 (e.g., FIG. 6-7; FIG. 16-17);
2. With the wafer chuck 116 in its chuck wafer transfer position, actuate the wafer lift system 104 to extend the wafer lift pins 140 through the corresponding openings 124 in the wafer chuck 116 until the wafer lift pins 140 reach their extended position whereby the upper surfaces 140S of the wafer lift pins 140 are located in the plane 141—the lift pin wafer transfer position (see, e.g., FIG. 10);
3. Actuate the wafer transfer system 106 to grasp a single wafer 118 from the wafer carrier and place the grasped wafer 118 on the extended wafer lift pins 140;
4. Actuate the gripper 138 so as to disengage from engagement with the wafer, thereby leaving the wafer 118 in place on the upper surfaces 140S of the wafer lift pins 140 with the wafer lift pins 140 in their extended wafer transfer position;
5. Withdraw the robotic arm 137/gripper 138 to a position where it will not interfere with movement of the wafer chuck 116 or other system components;
6. Actuate the wafer lift system 104 to move the wafer lift pins 140 back through the openings 124 in the wafer chuck 116 to their retracted position, whereby the upper surfaces 140S of the pins 140 are in a plane, whereby the wafer lift pins 140 do not interfere with any further movement of system components or wafer transfer operations. This operation results in the placement of the wafer 118 to be processed in the process chamber 130 on the upper surface of the wafer chuck 116;
7. Actuate the wafer chuck movement system to move the wafer chuck 116, with the wafer 118 positioned thereon, to the wafer processing position within the process chamber 130 in the processing tool 102 (see, e.g., FIGS. 2 and 12 (the sliding door 170 will be closed while processing the wafer 118);
8. Performing processing operations on the wafer 118 within the chamber 130 until completion;
9. Actuate the wafer chuck movement system to move the wafer chuck 116, with the now-processed wafer 118 positioned thereon, to the chuck wafer transfer position of the wafer chuck 116 (see, e.g., FIGS. 6-7 and 16-17);
10. With the wafer chuck 116 in its wafer transfer position, actuate the wafer lift system 104 to extend the wafer lift pins 140 through the openings 124 in the wafer chuck 116 and thereby engage the bottom of the now-processed wafer 118. Continue moving the wafer lift pins 140 upward until the wafer lift pins 140 are in their extended position whereby the upper surfaces 140S of the wafer lift pins 140 are located in the plane 141—the lift pin wafer transfer position (see, e.g., FIG. 10); and
11. Actuate the wafer transfer system 106 to grasp the now-processed wafer 118, lift the now-processed wafer off of the extended wafer lift pins 140 and return the now-processed wafer 118 to the wafer carrier.

Of course, as will be appreciated by those skilled in the art after a complete reading of the present application, many of the actions described immediately above may be performed at the same time and need not necessarily be entirely completed before another action is taken. For example, the wafer lift system 104 may be actuated to move the wafer lift pins 140 through the openings 124 in the wafer chuck 116 and toward their final extended wafer transfer position (surfaces 140S in plane 141) while the wafer handling system 106 is moving a wafer 118 that is to be processed in the chamber 130 toward the wafer chuck 116.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A system, comprising:
a processing tool;
a process chamber within said processing tool;
a wafer chuck, said wafer chuck adapted to be positioned at a wafer processing position located within said process chamber and at a chuck wafer transfer position located outside of said process chamber; and
at least one lift pin opening in said wafer chuck.

2. The system of claim 1, further comprising:
a wafer lift system positioned outside of said process chamber, said wafer lift system comprising at least one wafer lift pin, whereby, when said wafer chuck is in said chuck wafer transfer position, said at least one wafer lift pin is adapted to be extended though said at least one lift pin opening and positioned at a lift pin wafer transfer position; and
a wafer transfer system that is adapted to position a wafer to be processed in said process chamber on said at least one wafer lift pin when said at least one wafer lift pin is in said lift pin wafer transfer position.

3. The system of claim 1, wherein said wafer chuck is operatively coupled to a door that is adapted to engage a front face of said process chamber to close said process chamber and thereby position said wafer chuck at said wafer processing position within said process chamber.

4. The system of claim 3, wherein said wafer chuck is formed integral with said door.

5. The system of claim 1, wherein the system further comprises a slot that is in communication with said process chamber and a sliding door that is adapted to be moved from a first position whereby said slot is open and said wafer chuck may be positioned at said wafer processing position within said process chamber to a second position whereby said sliding door blocks said slot and said wafer chuck cannot be positioned within said process chamber.

6. The system of claim 2, wherein said wafer lift system comprises means for moving said at least one wafer lift pin from a fully retracted position to said lift pin wafer transfer position.

7. The system of claim 6, wherein said means for moving said at least one wafer lift pin comprises a moveable body, a motor, a pinion operatively coupled to said motor and a rack, wherein said at least one wafer lift pin is operatively coupled to said moveable body, said pinion is operatively coupled to said motor and said rack is operatively coupled to said moveable body, wherein said rack and pinion are adapted to operatively engage one another.

8. The system of claim 1, wherein said process chamber has a volume of at most 5 liters.

9. The system of claim 1, wherein said process chamber is adapted to withstand an internal pressure of at least 0.5 MPa.

10. The system of claim 1, wherein said process chamber comprises a notched recess in a floor of said process chamber, wherein said notched recess is adapted to receive said wafer chuck when said wafer chuck is positioned at said wafer processing position within said process chamber.

11. The system of claim 2, wherein said at least one wafer lift pin comprises three wafer lift pins.

12. A system, comprising:
a processing tool;
a process chamber within said processing tool, said process chamber comprising a notched recess in a floor of said process chamber and a volume of at most 5 liters;
a wafer chuck, said wafer chuck adapted to be positioned at a wafer processing position located within said process chamber and a chuck wafer transfer position located outside of said process chamber, wherein said wafer chuck is positioned in said notched recess when said wafer is positioned at said wafer processing position within said process chamber;
a plurality of lift pin openings in said wafer chuck;
a wafer lift system positioned outside of said process chamber, said wafer lift system comprising a plurality of wafer lift pins, whereby, when said wafer chuck is in said chuck wafer transfer position, each of said plurality of wafer lift pins is adapted to be extended though a corresponding one of said plurality of lift pin openings until said plurality of wafer lift pins are positioned at a lift pin wafer transfer position; and
a wafer transfer system that is adapted to position a wafer to be processed in said process chamber on said plurality of wafer lift pins when said plurality of wafer lift pins are positioned in said lift pin wafer transfer position.

13. The system of claim 12, wherein said wafer chuck is operatively coupled to a door that is adapted to engage a front face of said process chamber to close said process chamber and thereby position said wafer chuck at said wafer processing position within said process chamber.

14. The system of claim 12, wherein the system further comprises a slot that is in communication with said process chamber and a sliding door that is adapted to be moved from a first position whereby said slot is open and said wafer chuck may be positioned at said wafer processing position within said process chamber to a second position whereby said sliding door blocks said slot and said wafer chuck cannot be positioned within said process chamber.

15. The system of claim 12, wherein said process chamber is adapted to have an anneal process performed on a wafer positioned therein, wherein said anneal process is performed at a pressure of at least 0.5 MPa using a processing gas comprising deuterium or a halogen.

16. A system, comprising:
a processing tool;
a process chamber within said processing tool, said process chamber comprising a notched recess in a floor of said process chamber and a volume of at most 5 liters;
a wafer chuck, said wafer chuck adapted to be positioned at a wafer processing position located within said process chamber and a chuck wafer transfer position located outside of said process chamber, wherein said wafer chuck is positioned in said notched recess when said wafer is positioned at said wafer processing position within said process chamber;
a plurality of lift pin openings in said wafer chuck;
a wafer lift system positioned outside of said process chamber, said wafer lift system comprising a plurality of wafer lift pins, whereby, when said wafer chuck is in said chuck wafer transfer position, each of said plurality of wafer lift pins is adapted to be extended though a corresponding one of said plurality of lift pin openings until said plurality of wafer lift pins are positioned at a lift pin wafer transfer position; and
a wafer transfer system that is adapted to position a wafer to be processed in said process chamber on said plurality of wafer lift pins when said plurality of wafer lift pins are positioned in said lift pin wafer transfer position.

17. The system of claim 16, wherein said wafer chuck is operatively coupled to a door that is adapted to engage a front face of said process chamber to close said process chamber and thereby position said wafer chuck at said wafer processing position within said process chamber.

18. The system of claim 16, wherein the system further comprises a slot that is in communication with said process chamber and a sliding door that is adapted to be moved from a first position whereby said slot is open and said wafer chuck may be positioned at said wafer processing position within said process chamber to a second position whereby said sliding door blocks said slot and said wafer chuck cannot be positioned within said process chamber.

19. The system of claim 16, wherein said process chamber is adapted to have an anneal process performed on a wafer positioned therein, wherein said anneal process is performed at a pressure of at least 0.5 MPa using a processing gas comprising deuterium or a halogen.

* * * * *